United States Patent
Perez-Falcon et al.

(10) Patent No.: US 12,174,552 B2
(45) Date of Patent: Dec. 24, 2024

(54) LITHOGRAPHIC APPARATUS AND ELECTROSTATIC CLAMP DESIGNS

(71) Applicants: ASML Holding N.V., Veldhoven (NL); ASML Netherlands B.V., Veldhoven (NL)

(72) Inventors: Victor Antonio Perez-Falcon, Bridgeport, CT (US); Marcus Adrianus Van De Kerkhof, Helmond (NL); Daniel Leslie Hall, San Diego, CA (US); Christopher John Mason, Newtown, CT (US); Arthur Winfried Eduardus Minnaert, Veldhoven (NL); Johannes Hubertus Josephina Moors, Roosteren (NL); Samir A. Nayfeh, Dunn Loring, VA (US)

(73) Assignee: ASML Holding N.V., Veldhoven (NL)

( * ) Notice: Subject to any disclaimer, the term of this patent is extended or adjusted under 35 U.S.C. 154(b) by 156 days.

(21) Appl. No.: 17/773,004

(22) PCT Filed: Oct. 5, 2020

(86) PCT No.: PCT/EP2020/077877
§ 371 (c)(1),
(2) Date: Apr. 28, 2022

(87) PCT Pub. No.: WO2021/083617
PCT Pub. Date: May 6, 2021

(65) Prior Publication Data
US 2023/0008474 A1   Jan. 12, 2023

Related U.S. Application Data

(60) Provisional application No. 62/927,214, filed on Oct. 29, 2019.

(51) Int. Cl.
*G03F 7/00*     (2006.01)
*H01L 21/683*   (2006.01)
*H01L 21/687*   (2006.01)

(52) U.S. Cl.
CPC ...... *G03F 7/70708* (2013.01); *H01L 21/6833* (2013.01); *H01L 21/6875* (2013.01)

(58) Field of Classification Search
CPC . G03F 7/70708; G03F 7/707; H01L 21/6833; H01L 21/6831
See application file for complete search history.

(56) References Cited

U.S. PATENT DOCUMENTS 5,764,471 A * 6/1998 Burkhart ............. H01L 21/6833
                                                   361/234
5,923,521 A * 7/1999 Burkhart ............. H01L 21/6833
                                                   279/128

(Continued)

FOREIGN PATENT DOCUMENTS

CN        103236413 A      8/2013
JP       2006-152349 A     6/2006

(Continued)

OTHER PUBLICATIONS

International Search Report and Written Opinion of the International Searching Authority directed to related International Patent Application No. PCT/EP2020/077877, mailed Jan. 21, 2021; 10 pages.

(Continued)

*Primary Examiner* — Steven H Whitesell
(74) *Attorney, Agent, or Firm* — Sterne, Kessler, Goldstein & Fox P.L.L.C.

(57) ABSTRACT

Embodiments herein describe methods, devices, and systems for reducing an electric field at a clamp-reticle interface using an enhanced electrostatic clamp. In particular, the electrostatic clamp includes a clamp body, an electrode layer (Continued)

disposed on a top surface of the clamp body, and a plurality of burls that project from a bottom surface of the clamp body, wherein the electrode layer comprises a plurality of cutouts at predetermined locations that vertically correspond to locations of the plurality of burls at the bottom surface of the clamp body.

19 Claims, 8 Drawing Sheets

(56) References Cited

U.S. PATENT DOCUMENTS

| | | | |
|---|---|---|---|
| 8,911,601 | B2 | 12/2014 | Rasheed et al. |
| 9,101,038 | B2* | 8/2015 | Singh .................. H01L 21/6833 |
| 9,449,865 | B2 | 9/2016 | Hilbers |
| 10,049,908 | B2 | 8/2018 | Raj et al. |
| 10,325,800 | B2 | 6/2019 | Kulshreshtha et al. |
| 10,395,963 | B2 | 8/2019 | Cooke |
| 11,769,683 | B2 | 9/2023 | Boyd, Jr. et al. |
| 2004/0040665 | A1* | 3/2004 | Mizuno .................. H02N 13/00 118/728 |
| 2005/0030515 | A1* | 2/2005 | Ottens ................ G03F 7/70708 355/99 |
| 2006/0158823 | A1 | 7/2006 | Mizuno et al. |
| 2008/0239614 | A1* | 10/2008 | Blake .................. H01L 21/6833 361/234 |
| 2011/0164343 | A1* | 7/2011 | Sogard ................ H01L 21/6833 361/234 |
| 2013/0308116 | A1 | 11/2013 | Helmus et al. |
| 2014/0340813 | A1 | 11/2014 | Anada et al. |
| 2014/0368804 | A1* | 12/2014 | Lafarre ................ G03F 7/70733 355/72 |
| 2015/0002832 | A1* | 1/2015 | Cadee .................. H01L 21/6875 355/72 |
| 2015/0348815 | A1 | 12/2015 | Baldus |
| 2015/0370178 | A1* | 12/2015 | Klomp ................ G03F 7/70708 355/72 |
| 2019/0155178 | A1* | 5/2019 | Lin ...................... G03F 7/70925 |

FOREIGN PATENT DOCUMENTS

| | | |
|---|---|---|
| JP | 2009-177126 A | 8/2009 |
| JP | 2015-529968 A | 10/2015 |
| TW | 2012-25205 A | 6/2012 |
| TW | 2016-20005 A | 6/2016 |
| TW | 2017-19799 A | 6/2017 |
| TW | 2017-35238 A | 10/2017 |
| WO | WO 2013/160026 A2 | 10/2013 |
| WO | WO 2014/114395 A1 | 7/2014 |
| WO | WO 2018/007498 A1 | 1/2018 |

OTHER PUBLICATIONS

Research Disclosure No. 660031, Apr. 2019; 4 pages.
Research Disclosure No. 604008, Aug. 2014; 6 pages.
Japanese Search Report directed to Japanese Patent Application No. 2022-525319, mailed Jun. 19, 2024; 34 pages.
Notice of Reasons for Refusal directed to Japanese Application No. 2022-525319, Oct. 1, 2024; 6 pages.

* cited by examiner

LITHOGRAPHIC APPARATUS AND ELECTROSTATIC CLAMP DESIGNS

CROSS-REFERENCE TO RELATED APPLICATIONS

This application claims priority of U.S. Provisional Patent Application No. 62/927,214, which was filed on Oct. 29, 2019, and which is incorporated herein in its entirety by reference.

FIELD

The present disclosure relates to systems and methods for electrostatic clamp design and electric field reduction in lithographic apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A lithographic apparatus using EUV radiation may require that the EUV radiation beam path, or at least substantial parts of it, must be kept in vacuum during a lithographic operation. In such vacuum regions of the lithographic apparatus, an electrostatic clamp may be used to clamp an object, such as a patterning device and/or a substrate to a structure of the lithographic apparatus, such as a patterning device table and/or a substrate table, respectively.

In some cases, an electrostatic clamp may be utilized to hold a reticle in place in a lithography apparatus. An electrostatic clamp may include an electrode at a top surface of the clamp with a plurality of burls disposed on the bottom surface of the clamp. As the clamp is energized (e.g., using a clamping voltage) and pulls the reticle in contact with the burls, the conductive burl top may be at a different potential than the reticle backside. At the moment of contact, this potential difference causes a discharge mechanism as the two potentials are equalized. This discharge mechanism may cause material transfer and particle generation and ultimately result in damage to the reticle and/or clamp.

Additionally, a backfill gas may be provided at the burl-reticle interface in the electrostatic clamp to facilitate with cooling of the reticle and thermal conduction. In some cases, the backfill gas may act as an additional force on the reticle which may cause the reticle to lose contact with the burls in the electrostatic clamp, resulting in gaps between the reticle and clamp. In order to offset this force, the voltage of the electrostatic clamp may be increased. However, the increase in voltage may cause differences in charge between the burls and the reticle backside, and may generate discharge that may cause damage to the reticle/and or clamp.

SUMMARY

Accordingly, the present disclosure provides methods, devices, and systems for minimizing the electric field and discharge at contact points between burls of an electrostatic clamp and a reticle.

In some embodiments, an electrostatic clamp includes a clamp body, an electrode layer disposed on a top surface of the clamp body, and a plurality of burls that project from a bottom surface of the clamp body. The electrode layer includes a plurality of cutouts at predetermined locations that vertically correspond to locations of the plurality of burls at the bottom surface of the clamp body.

In some embodiments, a method of enhancing an electrostatic clamp includes fabricating the electrostatic clamp including a clamp body, an electrode layer disposed on a top surface of the clamp body, and a plurality of burls that project from a bottom surface of the clamp body, the plurality of burls being configured to contact a backside of a reticle. The method also includes applying a modification to the electrostatic clamp to reduce an electric field between the plurality of burls and the reticle.

In an embodiment, applying the modification includes reducing a thickness of a conductive coating on reticle-contacting surfaces of the plurality of burls allowing for a decreased voltage difference between the plurality of burls and the reticle. In another embodiment, applying the modification includes removing predetermined portions of the electrode layer at locations that correspond to locations of each burl allowing for a plurality of cutouts in the electrode layer.

In another embodiment, applying the modification includes connecting each burl in the plurality of burls together to provide a virtual ground in the electrostatic clamp. In another embodiment, applying the modification includes grounding the plurality of burls. In another embodiment, applying the modification includes applying a conductive coating to reticle-contacting surfaces of the plurality of burls or to the backside of the reticle, the conductive coating comprising an oxide, a diamond, or diamond-like carbon (DLC) material.

In some embodiments, a lithographic apparatus includes an illumination system, a support structure, a projection system. The illumination system conditions a radiation beam. The support structure is constructed to support a patterning device that is capable of imparting the radiation beam with a pattern in its cross-section to form a patterned radiation beam. The projection system is configured to project the patterned radiation beam onto a target portion of a substrate. The support structure includes an electrostatic clamp. The electrostatic clamp includes a clamp body, an electrode layer disposed on a top surface of the clamp body, and a plurality of burls that project from a bottom surface of the clamp body. The electrode layer includes a plurality of cutouts at predetermined locations that vertically correspond to locations of the plurality of burls at the bottom surface of the clamp body.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic System

Figure 1:
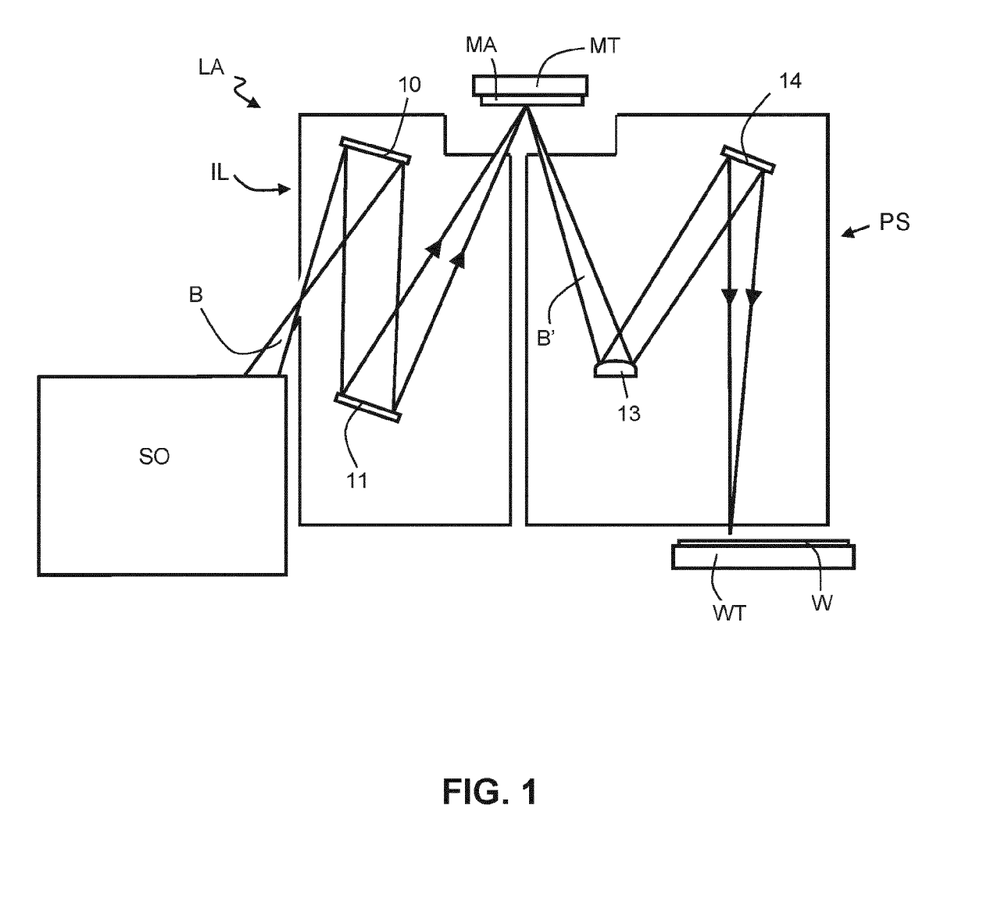
FIG. 1 is a schematic illustration of a lithographic apparatus, according to an embodiment of the present disclosure.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure (for example, mask table) MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Reticle Stage

Figure 2:
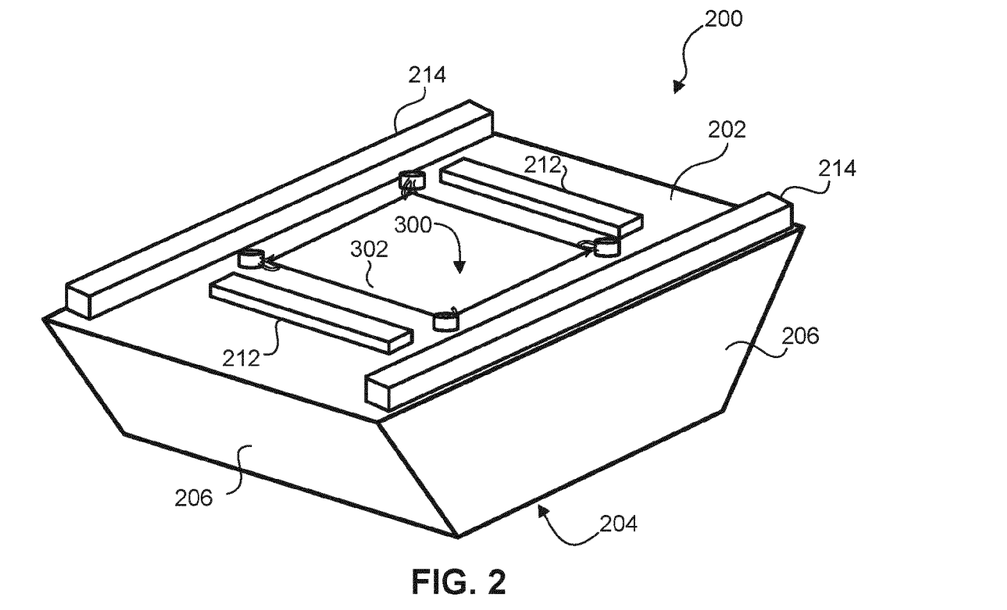
FIG. 2 is a perspective schematic illustration of a reticle stage, according to an embodiment of the present disclosure.
Figure 3:
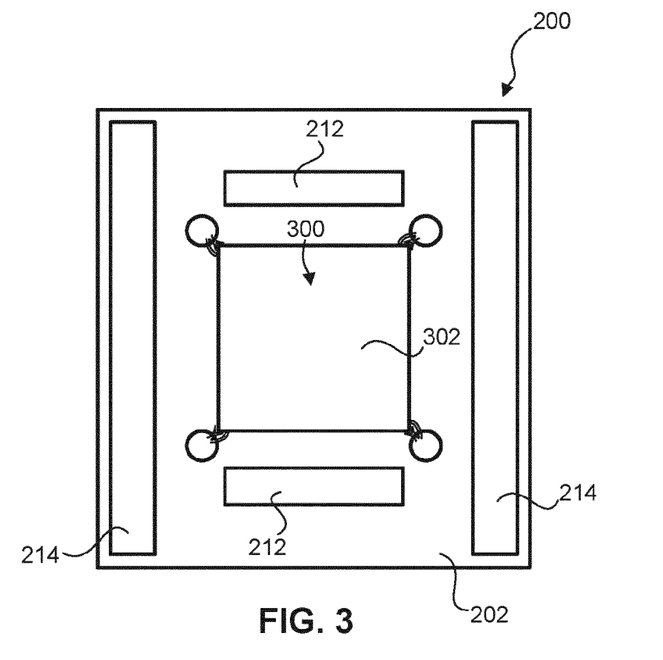
FIG. 3 is a top plan view of the reticle stage of FIG. 2.

FIGS. 2 and 3 show schematic illustrations of an exemplary reticle stage 200, according to some embodiments. Reticle stage 200 can include top stage surface 202, bottom stage surface 204, side stage surfaces 206, and clamp 300. In some embodiments, reticle stage 200 with clamp 300 can be implemented in lithographic apparatus LA. For example, reticle stage 200 can be support structure MT in lithographic apparatus LA. In some embodiments, clamp 300 can be disposed on top stage surface 202. For example, as shown in FIG. 2, clamp 300 can be disposed at a center of top stage surface 202 with clamp frontside 302 facing perpendicularly away from top stage surface 202.

In some lithographic apparatuses, for example, lithographic apparatus LA, a reticle stage 200 with a clamp 300 can be used to hold and position a reticle for scanning or patterning operations. In one example, the reticle stage 200 can require powerful drives, large balance masses, and heavy frames to support it. In one example, the reticle stage 200 can have a large inertia and can weigh over 500 kg to propel and position a reticle weighing about 0.5 kg. To accomplish reciprocating motions of the reticle, which are typically found in lithographic scanning or patterning operations, accelerating and decelerating forces can be provided by linear motors that drive the reticle stage 200.

In some embodiments, as shown in FIGS. 2 and 3, reticle stage 200 can include first encoder 212 and second encoder 214 for positioning operations. For example, first and second encoders 212, 214 can be interferometers. First encoder 212 can be attached along a first direction, for example, a transverse direction (i.e., X-direction) of reticle stage 200. And second encoder 214 can be attached along a second direction, for example, a longitudinal direction (i.e., Y-direction) of reticle stage 200. In some embodiments, as shown in FIGS. 2 and 3, first encoder 212 can be orthogonal to second encoder 214.

As shown in FIGS. 2 and 3, reticle stage 200 can include clamp 300. Clamp 300 is configured to hold a reticle in a fixed plane on reticle stage 200. Clamp 300 includes clamp frontside 302 and can be disposed on top stage surface 202. In some embodiments, clamp 300 can use electrostatic clamping techniques to hold and secure an object. For example, clamp 300 can be an electrostatic clamp, which can be configured to electrostatically clamp (i.e., hold) an object, such as a reticle in a vacuum environment. Due to the requirement for EUV radiation to perform in a vacuum environment, vacuum clamps cannot be used to clamp a mask or reticle and instead electrostatic clamps can be used. For example, clamp 300 can include an electrode, a resistive layer on the electrode, a dielectric layer on the resistive layer, and burls projecting from the dielectric layer. In use, a voltage can be applied to clamp 300, for example, several kV. And current can flow through the resistive layer, such that the voltage at an upper surface of the resistive layer will substantially be the same as the voltage of the electrode and generate an electric field. Also, a Coulomb force, attractive force between electrically opposite charged particles, will attract an object to clamp 300 and hold the object in place. In some embodiments, clamp 300 can be a rigid material, for example, a metal, a dielectric, a ceramic, or a combination thereof.

Exemplary Electrostatic Clamp Designs

Figure 4A:
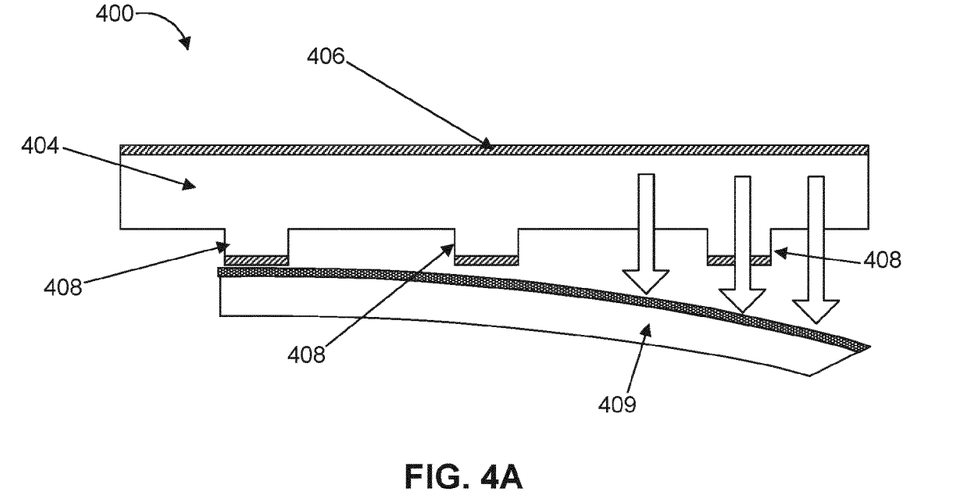
FIGS. 4A and 4B are schematic illustrations of an electrostatic clamp, according to embodiments of the present disclosure.
Figure 4B:
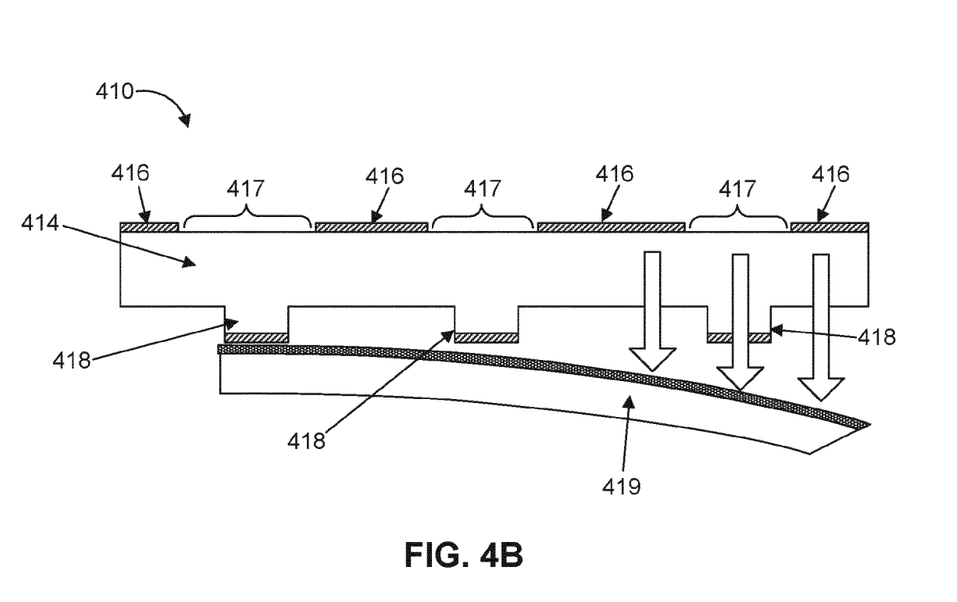

FIGS. 4A and 4B illustrate schematic diagrams of a side view of an electrostatic clamp 400 and 410, respectively, according to embodiments of the present disclosure. In some embodiments, electrostatic clamp 400 and 410 represent exemplary embodiments of clamp 300 shown in FIGS. 2 and 3. FIG. 4A illustrates electrostatic clamp 400 comprising a clamp body 404, an electrode layer 406, and a plurality of burls 408. The electrode layer 406 is disposed on a top surface of the electrostatic clamp 400, and the plurality of burls 408 project from a bottom surface of the electrostatic clamp 400, in which the clamp body 404 physically separates the electrode layer 400 from the burls 408.

In some embodiments, the clamp body 404 may have a height of approximately 100 micrometers and may comprise glass, ceramic and/or polymer materials, such as ultra-low expansion glass (ULE), lithium-aluminosilicate glass-ceramic, siliconized silicon carbide (SiSiC), benzocyclobutene-based polymers (BCB), or the like. The plurality of burls 408 comprise a conductive coating and are configured to contact a reticle 409. In some embodiments, the plurality of burls may have a height of approximately 10 micrometers. While the plurality of burls 408 are shown for illustrative purposes with a rectangular surface that contacts the reticle 409, it should be appreciated that the plurality of burls 408 may be cylindrically shaped with rounded edges or a circular surface or other areal geometries (e.g., square, ellipse, oval, and the like) that contacts the reticle 409. Also, while only three burls 408 are depicted in FIG. 4A, any number of burls 408 and any arrangement of burls (e.g., grid or randomized distribution) across the bottom surface of the clamp body 404 may be used. In some embodiments, the surfaces of the burls 408 which contact the reticle may be referred to as burl tops herein. As illustrated in FIG. 4A, the reticle 409 is shown, as an example, with a gravity sag resulting from gravitational forces that pull down on the reticle 409.

In some embodiments, the electrode layer 406 comprises a contiguous layer and may be made of any suitable conductive material, such as metal or metal alloy, for example, aluminum, chrome, platinum, gold, or any combination thereof. In some embodiments, the electrostatic clamp 400 may be energized, and a voltage may be applied to the electrode layer 406 to generate an electric field (as indicated by the arrows in FIG. 4A). The electric field may induce charges on a surface of the reticle 409 that are opposite the charges of the burls 408. Attractive forces between the burls 408 and reticle 409 may hold the reticle 409 in close contact with the electrostatic clamp 400. In some embodiments, the backside of the reticle 409 may be coated with a conductive thin film, which further allows the electrostatic clamp 400 to hold the reticle 409 in place via the attractive forces between the burls 408 and the conductive surface of the reticle 409.

In some embodiments, a voltage in a range of 100 to 5000 V may be applied to the electrode layer 406, in order to generate an electrostatic force that overcomes the gravitational force and attract the backside of the reticle 409 to the electrostatic clamp 400. However, the burls 408, which are the components of the electrostatic clamp 400 that interface with the backside of the reticle 409, may be at a different electric potential than the reticle 409. A potential difference at the burl-reticle interface causes a discharge that may result in potential material transfer, particle generation, and/or damage to the electrostatic clamp and/or reticle.

In some embodiments, FIG. 4B illustrates an electrostatic clamp 410 which minimizes the electric field and discharge at contact points between the electrostatic clamp and reticle.

In some embodiments, electrostatic clamp 410 comprises a clamp body 414, an electrode layer 416, and a plurality of burls 418.

In some embodiments, the electrode layer 416 comprises a plurality of cutouts 417 or gaps in which the electrode material has been removed at locations in the top surface of the clamp body 414. In some embodiments, the locations of the plurality of cutouts 417 in the electrode layer 416 may vertically correspond to the locations of the burls 418 in the bottom surface of the clamp body 414. For example, a cutout 417 may be located directly above the location of a respective burl 418 in the electrostatic clamp 414. Each cutout 417 may comprise a circular cutout (or other areal geometries, such as square, ellipse, oval, and the like) that lies concentrically to the location of a respective burl 418, but at the top surface of the clamp body 414 rather than at the bottom surface of the clamp body 414. While only three burls 418 and three cutouts 417 are depicted in FIG. 4B, any number of burls 418 and cutouts 417 and any arrangement across the bottom surface and top surface of the clamp body 414, respectively, may be used. In some embodiments, by interrupting the electrode layer 416 with cutouts 417 in the vicinity of the burls 418, the electric field at the burls 418 may be greatly reduced in order to improve the contact points between the electrostatic clamp 410 and the reticle 419 and minimize discharge.

Figure 5:
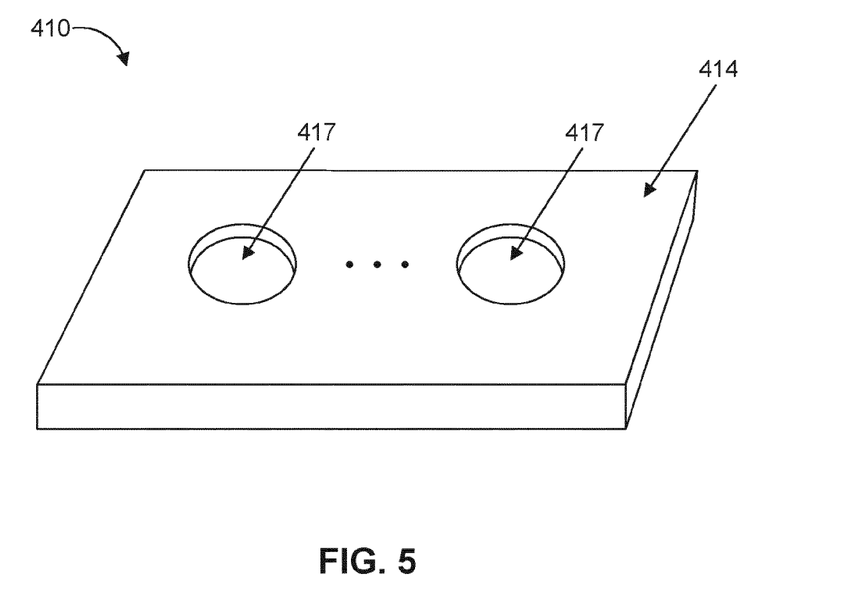
FIG. 5 is a three-dimensional perspective view of the top of an electrostatic clamp, according to embodiments of the present disclosure.

FIG. 5 is a three-dimensional perspective view of the top of electrostatic clamp 410, according to embodiments of the present disclosure. For example, FIG. 5 shows the electrode layer 414 at the top surface of the electrostatic clamp 410. The electrode layer 414 can comprise cutouts 417 or gaps in which the electrode material has been removed at locations in the top surface of the clamp that correspond to locations of the burls 418 in the bottom surface of the clamp. In some embodiments, predetermined portions of the electrode layer 414 may be removed by machining processes, etching, laser ablation, or the like, allowing for formation of the cutouts 417. For example, etching may be used to strip away predetermined portions of the electrode layer 414, such as by using chemicals in wet or dry etching techniques. Although only two cutouts 417 with circular areas are shown in FIG. 5, it should be appreciated that any number of cutouts 417 with other areal geometries (e.g., square, ellipse, oval, and the like) may be used in the electrode layer 414. In some embodiments, each cutout 417 may have a height (e.g., a thickness) of approximately 50 to 2000 nanometers (nm) and a diameter of approximately 800 to 1,400 micrometers. In some embodiments, removing a predetermined electrode area of 300 um around the burl may reduce the electrode area by approximately 7%. Thus, a higher clamping force and clamping voltage may be needed to account for this areal reduction.

Figure 6A:
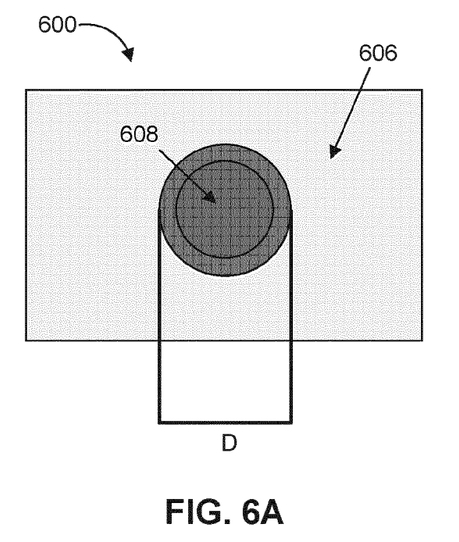
FIGS. 6A, 6B, and 6C are schematic diagrams of a bottom plan view of a burl in an electrostatic clamp, according to embodiments of the present disclosure.
Figure 6B:
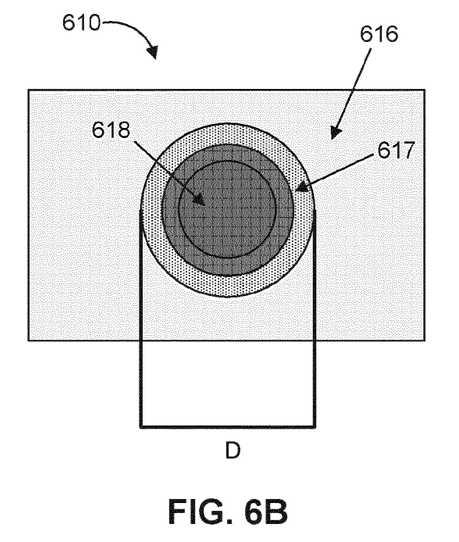
Figure 6C:
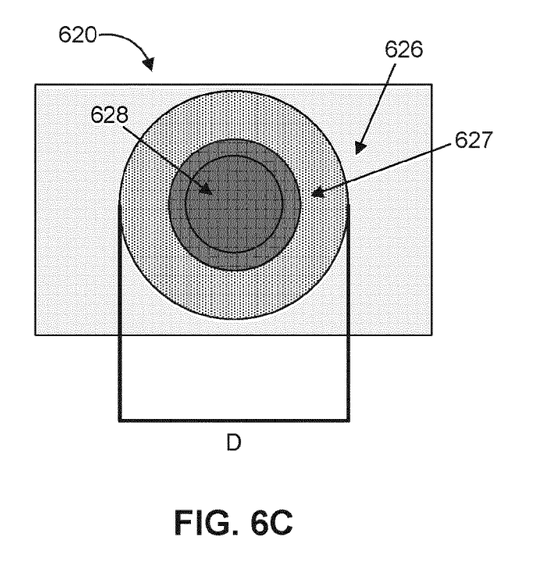

FIGS. 6A, 6B, and 6C are schematic diagrams of a bottom plan view of a burl in an electrostatic clamp, according to embodiments of the present disclosure. In particular, FIG. 6A shows a configuration 600 of an electrostatic clamp with an electrode layer 606 and a burl 608, in which the electrode layer 606 is a contiguous layer without any cutouts. In some embodiments, electrode layer 606 and burl 608 may represent exemplary embodiments of electrode layer 406 and burl 408, respectively, shown in FIG. 4A. The burl 608 and electrode layer 606 may be separated by the electrostatic clamp body (as shown by clamp body 404 in FIG. 4A). In some embodiments, burl 608 may have a diameter D of approximately 460 micrometers and may be configured to contact a backside of a reticle. In some examples, the electric potential differences between the burl 608 and the reticle may cause a discharge that can result in damage to the reticle and/or electrostatic clamp.

FIG. 6B shows a configuration 610 of an electrostatic clamp with an electrode layer 616, cutout 617, and burl 618. In some embodiments, electrode layer 616, cutout 617, and burl 618 may represent exemplary embodiments of electrode layer 416, cutout 417, and burl 418, respectively, shown in FIG. 4B. In some embodiments, the cutout 617 comprises a portion of a predetermined area that is removed from the electrode layer 616 in order to reduce the electric field at the burl 618. In some embodiments, by applying a cutout 617 in electrode layer 616, the area of the electrode layer 616 may be reduced. In some embodiments, the reduction in area may necessitate a higher clamping force for maintaining contact between the electrostatic clamp and a reticle. Thus, a higher clamping voltage may be needed to compensate for the loss in electrode area and provide an adequate clamping force for maintaining contact at the clamp-reticle interface. In some embodiments, the clamping force uniformity may be maintained due to spatial filtering enabled by the reticle stiffness. For example, spatial filtering may occur due to the thickness of the reticle. In other words, increasing the thickness of a reticle may cause small local variations on the backside of the reticle to be "blurred" and effectively filtered out from being printed through to the front.

In some embodiments, one or more portions of the electrode layer 616 may be removed, allowing for one or more cutouts 617 comprising a diameter D of approximately 800 micrometers. For example, by removing one or more portions of the electrode layer 616 (e.g., cutouts 617 with a diameter D of 800 um), the electric field at burl 618 may be reduced by a factor of approximately 8.8, and the clamping voltage may be raised by a factor of approximately 1.07 to maintain the clamping force, resulting in a gain factor of approximately 8.2.

FIG. 6C shows another configuration 620 of an electrostatic clamp with an electrode layer 626, cutout 627, and burl 628, according to an embodiment. In some embodiments, electrode layer 626, cutout 627, and burl 628 may represent exemplary embodiments of electrode layer 416, cutout 417, and burl 418, respectively, shown in FIG. 4B. In configuration 620, one or more portions of the electrode layer 626 may be removed, allowing for one or more cutouts 627 comprising a diameter D of approximately 1,400 micrometers. In some embodiments, a cutout diameter D of approximately 1,400 micrometers may allow for the electric field at burl 628 to be reduced by a factor of approximately 125. Additionally, the clamping voltage may be raised by a factor of approximately 1.26 to maintain the clamping force, resulting in a gain factor of approximately 99.

Exemplary Embodiments for Electric Field Reduction

In some embodiments, methods further enhance electrostatic clamp designs to minimize electric fields and improve the burl-reticle interface. In some embodiments, a reticle may sag due to gravity and/or backfill gas, and can therefore lose contact even when the clamping voltage is at a significant level (e.g., approximately hundreds of volts) during unloading and reclamping in a reticle stage. This loss of contact may lead to micro-gap discharges (e.g., electric arc or arc discharge) in the gaps in between the clamp and reticle. Also, in some embodiments, contact between the burl top (e.g., the surface of the burl that contacts the reticle) and the reticle backside may only be made when the clamping voltage is at several hundreds of volts during loading (and re-contacting part of reclamping). Additionally, the burl tops may often still be charged with an opposite polarity from the previous clamping event (when charged at the opposite polarity). For example, this charge may have a value of approximately 10-100 piccoulombs (pC).

In some embodiments, not only can this charge difference cause micro-gap discharges, but it may also result in current flowing through an asperity of the burl top and/or the asperity breaking through an insulating reticle coating oxide top layer. For example, this may lead to a local temperature greater than 10,000 K, along with local melting or vaporization of the materials (both metals and oxides), inevitable material transfer, and/or micro-welding. The charge differences may also cause sticking of the reticle and overlay issues for end users.

Figure 7:
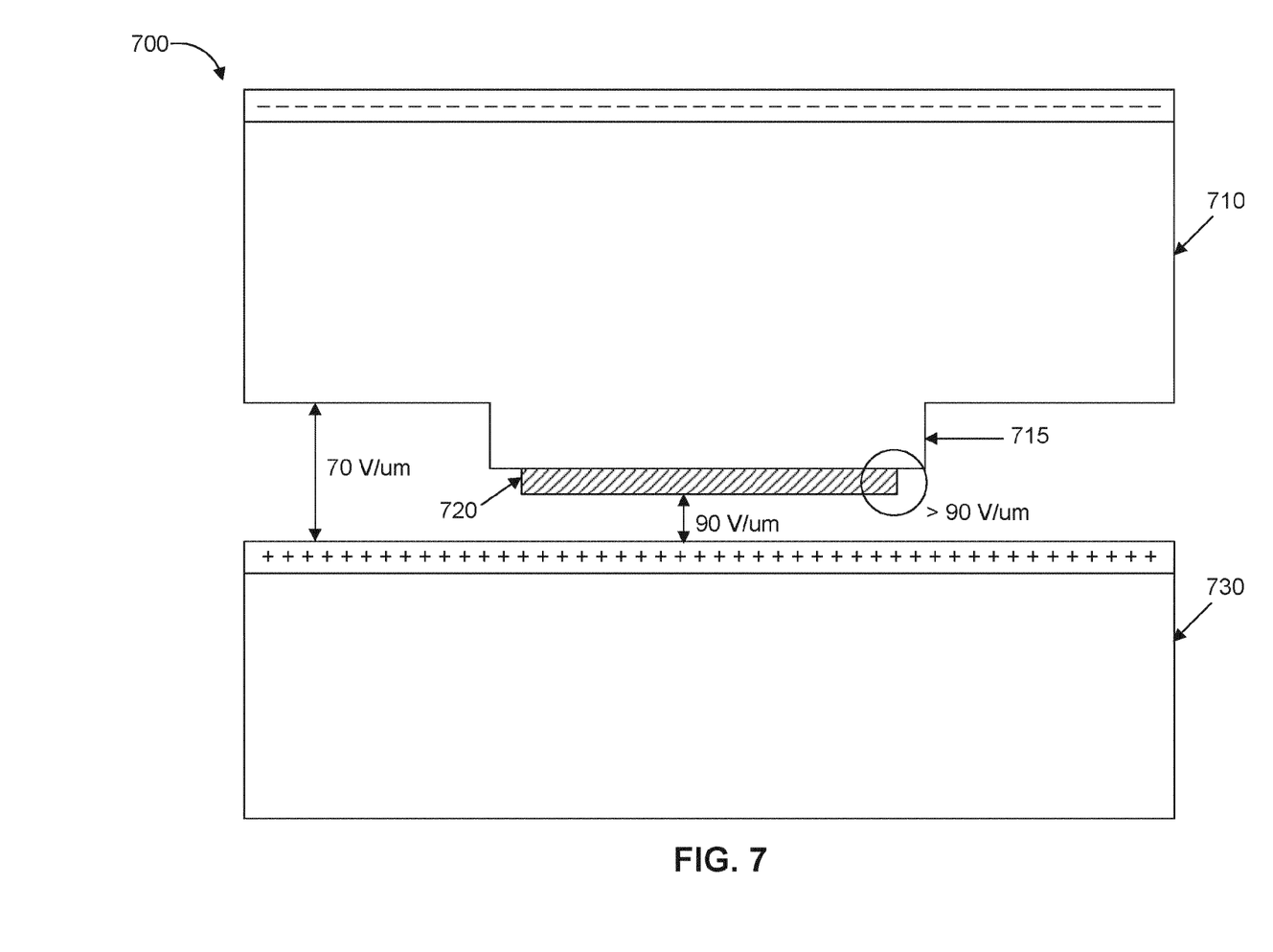
FIG. 7 is a schematic diagram of the burl-reticle interface in an electrostatic clamp, according to according to embodiments of the present disclosure.

FIG. 7 is a schematic diagram of the burl-reticle interface 700 in an electrostatic clamp, according to according to embodiments of the present disclosure. The burl-reticle interface 700 comprises an electrostatic clamp 710, a burl 715, a burl top 720, and a reticle 730. While only one burl 715 is shown in FIG. 7, there may be any number of burls 715 in the electrostatic clamp 710.

In some embodiments, the burl-reticle interface 700 may intrinsically be on the edge of barrier layer breakdown, with a nominal value of greater than 90 V/um on the burl top for a 2 kV clamping voltage and even higher at places of field amplification such as furrow ridges. For example, the barrier layer breakdown may be referred to as fritting which may occur for internal fields on the order of 100 V/um. In some embodiments, the electric field is intrinsically higher above the burl top 720 than in locations between adjacent burls 715 because the burl 715 is dielectric (e.g., 110 microns with dielectric constant, $\varepsilon_r$~5), without a 10 um vacuum gap. While the electric field in-between burls (in vacuum gap) is ~70 V/um for 2 kV clamping voltage, the on-burl field is greater than 80 V/um, as shown in FIG. 7. In some embodiments, this barrier breakdown threshold may shift to lower field values when mechanical shear compromises the barrier layer integrity, as is to be expected in actual clamping.

Accordingly, some embodiments of the present disclosure provide methods and devices for improving the burl-reticle interface to reduce electric fields by optimizing the electrostatic clamp. In some embodiments, the electrostatic clamp may be optimized to reduce electric fields at the burl-reticle interface by applying various modifications to the clamp. One example of a modification that may be applied is reducing a thickness of a conductive coating on reticle-contacting surfaces (e.g., burl tops) of the plurality of burls of an electrostatic clamp. For example, the conductive layer or coating on the burl tops comprises titanium nitride (TiN), and the voltage difference between the burls and reticle may be estimated to be on the order of greater than 10 V for a ~100 nm burl top. In some embodiments, it may be desirable to minimize this voltage difference to less than 1 V, which may be achieved by reducing the thickness of the conductive layer on the burl top to less than 10 nm. Thus, the local field between the burl top and reticle may be reduced by applying a thinner conductive layer on the burl top, such that the voltage at the burl top is closer to the voltage of the reticle backside before contact with a decreased voltage difference between the plurality of burls and the reticle.

In some embodiments, a modification includes minimizing local fields by connecting each burl in a plurality of burls together to provide a virtual ground in the electrostatic clamp. For instance, the burls may be electrically connected to effectively be one electrical surface in combination. This modification may keep the burl tops at virtual ground, so that the burls are at about the same voltage as the reticle backside (e.g., within the limits of electrode tolerances which are small in this context at less than about 1% or ~20 V for 2 kV).

In some embodiments, a virtual ground may be easier to implement than full grounding because an external interface is not needed and there is not any risk of grounding loops in virtual grounding.

In some embodiments, the plurality of burl tops in an electrostatic clamp may be physically grounded to minimize local fields at the burl-reticle interface. This modification may keep the burl tops at a ground of about 0 V, such that the burls are at the same voltage as the reticle backside which is virtually grounded.

Figure 8:
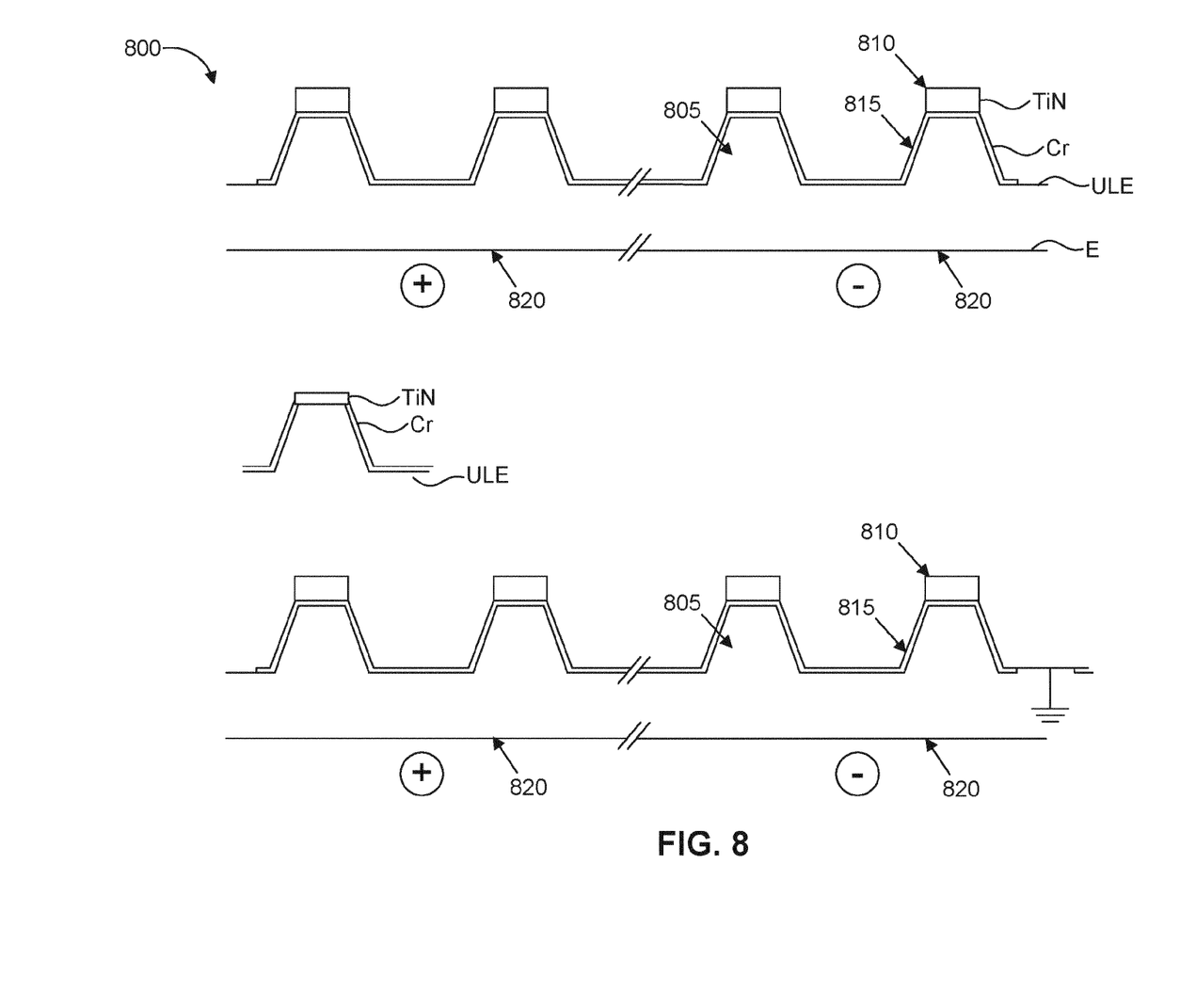
FIG. 8 is a schematic diagram of electrically connected burls in an electrostatic clamp, according to embodiments of the present disclosure.

FIG. 8 is a schematic diagram of electrically connected burls in an electrostatic clamp, according to embodiments of the present disclosure. In particular, FIG. 8 shows a plurality of burls 805, burl tops 810, a coating 815, and electrodes E 820. In some embodiments, the electrostatic clamp may comprise four electrodes 820, in which two of the electrodes 820 operate at positive voltages, whereas the other two electrodes 820 operate at negative voltages. The plurality of burls 805 may comprise chromium (Cr) or chromium nitride (CrN), and the burl tops 810 may comprise titanium nitride (TiN), whereas the clamp body of the electrostatic clamp may comprise glass, ceramic and/or polymer materials, such as ultra-low expansion glass (ULE), lithium-aluminosilicate glass-ceramic, siliconized silicon carbide (SiSiC), benzocyclobutene-based polymers (BCB), or the like.

In some embodiments, the burl tops 810 may be electrically connected to establish a virtual ground. For example, the electrical connection of the burl tops 810 may be below the coating 815, in which the coating 815 is a wear-resistant coating that can be conductive or non-conductive. In another example, the electrical connection of the burl tops 810 may be on the sides of the coating 815, in which the coating 815 may be conductive.

In some embodiments, by interconnecting the burl tops 810 above the positive electrode 820 with those above the negative electrode 820, a virtual grounding may be achieved. In some embodiments, all burl-tops 810 may be at 0 V (e.g., depending on the exact balancing of the electrodes). Thus, the burl tops may be at the same potential as a reticle backside, which may prevent risk of fritting and discharge as the reticle and burls come into contact. In some embodiments, the configuration shown in FIG. 8 may include a grounding connection to establish a proper zero voltage for the burl tops 810.

Some embodiments of modifying an electrostatic clamp to enhance the burl-reticle interface may include optimizing reticle coatings, burls, and operating conditions. In some embodiments, optimizing reticle coatings may include applying a conductive coating to reticle-contacting surfaces of the plurality of burls or to the backside of the reticle, in which the conductive coating comprises an oxide, a diamond, or diamond-like carbon (DLC) material. For example, a reticle backside coating or top layer may be optimized by using materials which form a conductive oxide, in order to prevent formation of a dielectric barrier in case of oxidation during manufacture, storage, and/or cleaning. In some embodiments, a semi-conducting oxide may be considered for the coating, such as titanium dioxide (TiOx), vanadium oxide (VOx), or the like.

In some embodiments, a thick and robust top layer on a reticle backside coating may also be utilized to push the limit of the fritting effect to a higher voltage, and to make the reticle less susceptible to mechanical deformations during clamping or usage. In some embodiments, the reticle coating may necessitate compatible cleaning processes to maintain the quality and thickness of the layer.

In some embodiments, fritting involves an insulating barrier, such as that formed by most metal-oxides. Certain metal oxides, such as molybdenum dioxide ($MoO_2$), ruthenium (IV) oxide ($RuO_2$), and the like, may remain conductive while still presenting a wear-resistant top-layer, so these might not result in fritting. Similarly, a wear-resistant non-metallic layer, such as DLC or (nano) diamond, may be protected by designing in some conductivity, e.g., by doping with boron (B).

In some embodiments, the burls of an electrostatic clamp may also be optimized in order to minimize electric fields at the burl-reticle interface. In some embodiments, the conductive burl top material may be replaced by an all-dielectric burl top material in order to prevent charge accumulation in the burl top and field amplification at the burl-reticle interface. In some embodiments, a non-conductive or dielectric burl top may be susceptible to a triboelectric effect (or contact charging); however, this is not considered to be an issue in view of the conductive reticle backside coating (as opposed to wafer clamping).

In some embodiments, the conductive burl top material may be replaced with a poorly conducting burl top material, such as a material with a very high sheet resistance. Using a poorly conductive material for the burl top may reduce fritting currents, as well as charge equalization currents after polarity switching, to keep instantaneous temperatures low enough to prevent local melting and electrochemical migration. In some embodiments, field amplification may also be prevented by avoiding sharp features, edges, and triple-points close to the burl-reticle interface, including sharp geometrical steps such as furrow ridges. In some embodiments, burl top materials may be selected such that the burl material is transferred to the reticle (e.g., Au/Pt/Ag-containing alloys).

In some embodiments, the operating conditions of the electrostatic clamp may be optimized to reduce electric fields at the burl-reticle interface. For example, backfill gas pressure may be removed during reclamping and unloading of a reticle (e.g., when reticle is coming into contact with burl tops). This may lead to a much lower push-off force and a much lower clamping voltage at which the burl-reticle contact is broken and reestablished. Removal of backfill gas pressure may also indicate less residual charge on burl tops; thus, there may be less current to equalize when contact is reestablished after switching polarity (e.g., at reclamp or at unload-load sequence). In some embodiments, the backfill gas may be actively pumped out through supply lines to avoid or minimize throughput impact. For example, waiting for backfill gas to leak out through leak seals might take a long period of time. Thus, the supply lines may double as pump-down lines to actively remove the backfill gas.

In some embodiments, residual charges from burl tops with opposing polarity may be removed between unloading and loading by exposure to an ionized gas (e.g., ionization by EUV-induced plasma or by a dedicated ionizer). In some embodiments, a dedicated ionizer may be in close proximity or integrated into the electrostatic clamp (e.g., hydrogen supply points). In some embodiments, a conductive medium or an ionized gas (e.g., plasma) may be applied to the burl-reticle interface while the reticle is present in the electrostatic clamp in order to discharge the burl tops and the reticle and maintain uniform potential.

In some embodiments, an operating condition may be modified, and the reticle backside may be de-humidified prior to loading/clamping to prevent residual adsorbed water to reduce fritting. In some embodiments, a dry interface between burl and reticle may solely carry current through a weak spot in the oxide barrier layer if the asperities of the burl match up with such a weak spot; this may have a finite probability. A humid surface may create surface conductivity on the reticle, which means that above alignment between the asperity and the weak spot might only need to be approximate to create fritting current through the oxide barrier weak spot; this increases probability of fritting. Thus, de-humidifying the reticle backside surface would help to reduce fritting.

In some embodiments, the reticle backside coating may be conditioned prior to loading/clamping to strengthen or restrengthen the top layer (e.g., oxide) to minimize fritting risk and/or shearing damage. This reticle conditioning may be implemented as a step during reticle cleaning and/or storage requirements.

In some embodiments, by applying these various modifications to the electrostatic clamp as described herein, the electrostatic clamp may be enhanced to reduce an electric field between the burls and reticle, and thus preventing sticking or adherence of reticles, and removal of high-order drift due to particles forming from reticle materials by re-clamping. Other benefits include an improvement in the reticle loading grid and increased design freedom to deal with reticle heating (e.g., from more frequent reclamps).

Example Method of Operation

Figure 9:
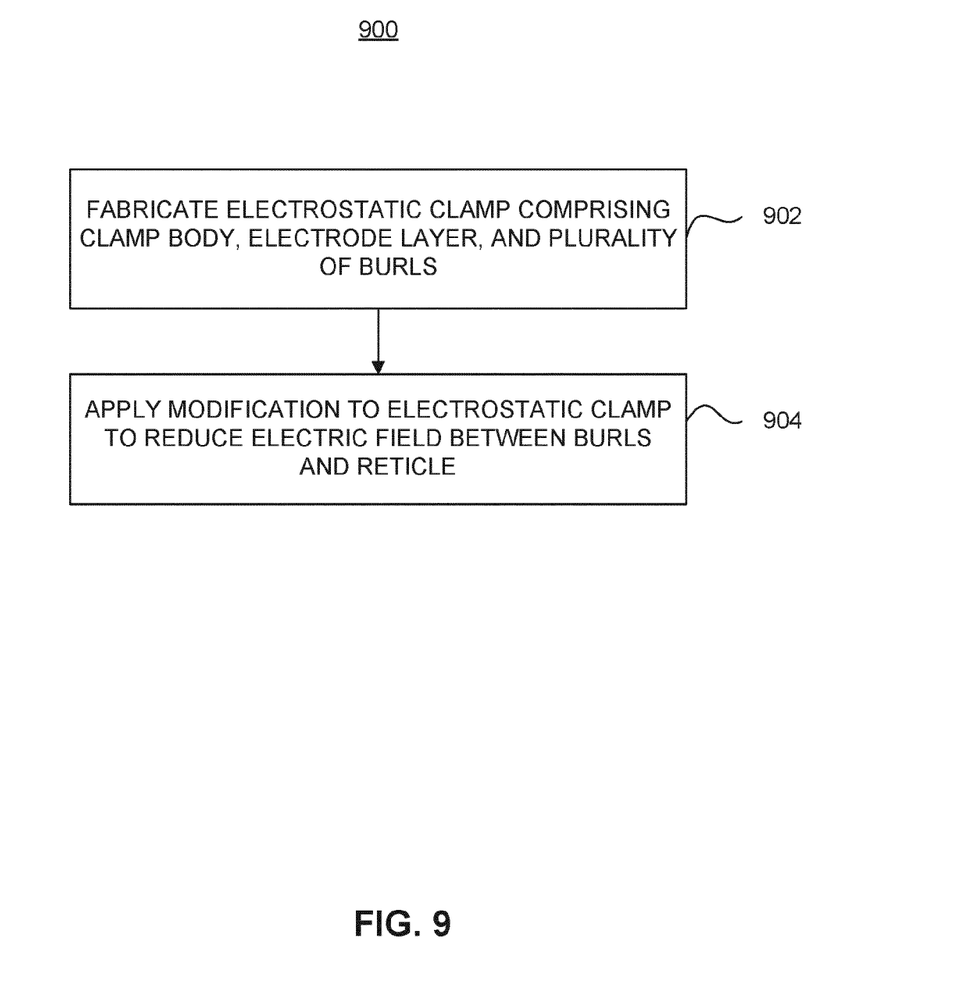
FIG. 9 is a schematic illustration of a flowchart for enhancing an electrostatic clamp, according to embodiments of the present disclosure.

FIG. 9 is a flowchart of an exemplary method 900 for enhancing an electrostatic clamp, according to embodiments of the present disclosure. In some embodiments, method 900 may describe the fabrication and modification of an electrostatic clamp, such as electrostatic clamp 400, 410, and/or 710 as discussed above with reference to FIGS. 2-8. It should be understood that the operations shown in method 900 are not exhaustive and that other operations can be performed as well before, after, or between any of the illustrated operations. In various embodiments of the present disclosure, the operations of method 900 can be performed in a different order and/or vary.

In operation 902, an electrostatic clamp is fabricated. The electrostatic clamp is fabricated to include a clamp body, an electrode layer disposed a top surface of the clamp body, and a plurality of burls that project from a bottom surface of the clamp body, the plurality of burls being configured to contact a backside of a reticle. In some embodiments, the electrostatic clamp may be fabricated by depositing an electrode layer onto an insulating substrate. The insulating substrate may comprise glass, ceramic, or the like. An insulating layer is then placed and bonded to (or deposited on top of) the electrode layer. In some embodiments, the plurality of burls may be formed to project from a bottom surface of the insulating substrate (e.g., the clamp body). For example, the plurality of burls may be formed by a lithographic process, in which a mask is applied to the clamp surface, and the unmasked material (e.g., portions of the clamp surface that are not covered by the mask) is etched away, resulting in the plurality of burls. In other embodiments, the plurality of burls may be formed by a film deposition process. In some embodiments, the plurality of burls may be coated with a predetermined material, and the coating may function to ground a reticle and/or provide a wear-resistant interface between the burls and reticle.

In operation 904, a modification is applied to the electrostatic clamp to reduce the electric field between the plurality of burls and the reticle. Applying a modification may include reducing a thickness of a conductive coating on reticle-contacting surfaces of the plurality of burls allowing for a decreased voltage difference between the plurality of burls and the reticle and/or removing predetermined portions of the electrode layer at locations that correspond to locations of each burl allowing for a plurality of cutouts in the electrode layer.

In some embodiments, applying a modification may also include connecting each burl in the plurality of burls together to provide a virtual ground in the electrostatic clamp, grounding the plurality of burls, and/or applying a conductive coating to reticle-contacting surfaces of the plurality of burls or to the backside of the reticle, the conductive coating comprising an oxide, a diamond, or diamond-like carbon (DLC) material.

Other aspects of the invention are set out in the following numbered clauses.

1. An electrostatic clamp comprising:
    a clamp body;
    an electrode layer disposed on a top surface of the clamp body; and
    a plurality of burls that project from a bottom surface of the clamp body,
    wherein the electrode layer comprises a plurality of cutouts at predetermined locations that vertically correspond to locations of the plurality of burls at the bottom surface of the clamp body.
2. The electrostatic clamp of clause 1, wherein the plurality of burls comprises contact points between the electrostatic clamp and a reticle.
3. The electrostatic clamp of clause 1, wherein the plurality of cutouts comprises gaps in the electrode layer that reduce electric fields generated around the plurality of burls.
4. The electrostatic clamp of clause 1, wherein the plurality of burls are configured to contact a backside of a reticle.
5. The electrostatic clamp of clause 4, wherein the reticle comprises a conductive coating.
6. The electrostatic clamp of clause 1, wherein each burl in the plurality of burls comprises a conductive coating.
7. The electrostatic clamp of clause 1, wherein each cutout in the plurality of cutouts has a diameter of approximately 300 to 1,400 micrometers.
8. A method of enhancing an electrostatic clamp, the method comprising:
    fabricating the electrostatic clamp comprising a clamp body, an electrode layer disposed on a top surface of the clamp body, and a plurality of burls that project from a bottom surface of the clamp body, the plurality of burls being configured to contact a backside of a reticle; and
    applying a modification to the electrostatic clamp to reduce an electric field between the plurality of burls and the reticle.
9. The method of clause 8, wherein the applying comprises reducing a thickness of a conductive coating on reticle-contacting surfaces of the plurality of burls allowing for a decreased voltage difference between the plurality of burls and the reticle.
10. The method of clause 8, wherein the applying comprises removing predetermined portions of the electrode layer at locations that correspond to locations of each burl allowing for a plurality of cutouts in the electrode layer.
11. The method of clause 8, wherein the applying comprises connecting each burl in the plurality of burls together to provide a virtual ground in the electrostatic clamp.
12. The method of clause 8, wherein the applying the modification to the electrostatic clamp comprises grounding the plurality of burls.
13. The method of clause 8, wherein the applying the modification to the electrostatic clamp comprises applying a conductive coating to reticle-contacting surfaces of the plurality of burls or to the backside of the reticle, the conductive coating comprising an oxide, a diamond, or diamond-like carbon (DLC) material.
14. A lithographic apparatus comprising:
    an illumination system configured to condition a radiation beam;
    a support structure constructed to support a patterning device, the patterning device being capable of imparting the radiation beam with a pattern in its cross-section to form a patterned radiation beam; and
    a projection system configured to project the patterned radiation beam onto a target portion of a substrate,
    the support structure comprising an electrostatic clamp comprising:
        a clamp body;
        an electrode layer disposed on a top surface of the clamp body; and
        a plurality of burls that project from a bottom surface of the clamp body, wherein the electrode layer comprises a plurality of cutouts at predetermined locations that vertically correspond to locations of the plurality of burls at the bottom surface of the clamp body.

15. The lithographic apparatus of clause 14, wherein the plurality of burls comprises contact points between the electrostatic clamp and the patterning device.

16. The lithographic apparatus of clause 14, wherein the plurality of cutouts comprises gaps in the electrode layer that reduce electric fields generated around the plurality of burls.

17. The lithographic apparatus of clause 14, wherein:
the patterning device comprises a reticle; and
the plurality of burls are configured to contact a backside of the reticle.

18. The lithographic apparatus of clause 17, wherein the reticle comprises a conductive coating.

19. The lithographic apparatus of clause 14, wherein each burl in the plurality of burls comprises a conductive coating.

20. The lithographic apparatus of clause 14, wherein each cutout in the plurality of cutouts has a diameter of approximately 300 to 1,400 micrometers.

Final Remarks

Although specific reference may be made in this text to a "reticle," it should be understood that this is just one example of a patterning device and that the embodiments described herein may be applicable to any type of patterning device. Additionally, the embodiments described herein may be used to provide safety support for any object to ensure a clamping failure does not cause the object to fall and damage either itself or other equipment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An electrostatic clamp comprising:
a clamp body;
an electrode layer disposed on a top surface of the clamp body; and
a plurality of burls that project from a bottom surface of the clamp body,
wherein the electrode layer comprises a plurality of cutouts at predetermined locations that vertically correspond to locations of the plurality of burls at the bottom surface of the clamp body, the plurality of cutouts comprising at least a first cutout having a first diameter and a second cutout having a second diameter that is different from the first diameter, and wherein the first diameter and the second diameter are configured, at the predetermined locations, to reduce electric fields that are generated around the plurality of burls.

2. The electrostatic clamp of claim 1, wherein the plurality of burls comprises contact points between the electrostatic clamp and a reticle.

3. The electrostatic clamp of claim 1, wherein the plurality of burls are configured to contact a backside of a reticle.

4. The electrostatic clamp of claim 3, wherein the reticle comprises a conductive coating.

5. The electrostatic clamp of claim 1, wherein each burl in the plurality of burls comprises a conductive coating.

6. The electrostatic clamp of claim 1, wherein each cutout in the plurality of cutouts has a diameter of approximately 300 to 1,400 micrometers.

7. The electrostatic clamp of claim 1, wherein each of the plurality of cutouts comprises a diameter that is larger than a diameter of each of the plurality of burls.

8. A method of enhancing an electrostatic clamp, the method comprising:
fabricating the electrostatic clamp comprising a clamp body, an electrode layer disposed on a top surface of the clamp body, and a plurality of burls that project from a bottom surface of the clamp body, the plurality of burls being configured to contact a backside of a reticle; and
modifying by removing portions of the electrode layer to create a plurality of cutouts comprising at least a first cutout having a first diameter and a second cutout having a second diameter that is different from the first diameter, wherein
the first diameter and the second diameter are configured to reduce an electric field between the plurality of burls and the reticle.

9. The method of claim 8, further comprising reducing a thickness of a conductive coating on reticle-contacting surfaces of the plurality of burls allowing for a decreased voltage difference between the plurality of burls and the reticle.

10. The method of claim 8, further comprising connecting each burl in the plurality of burls together to provide a virtual ground in the electrostatic clamp.

11. The method of claim 8, further comprising grounding the plurality of burls.

12. The method of claim 8, further comprising applying a conductive coating to reticle-contacting surfaces of the plurality of burls or to the backside of the reticle, the conductive coating comprising an oxide, a diamond, or diamond-like carbon (DLC) material.

13. A lithographic apparatus comprising:
an illumination system configured to condition a radiation beam;
a support structure constructed to support a patterning device, the patterning device being capable of imparting the radiation beam with a pattern in its cross-section to form a patterned radiation beam; and
a projection system configured to project the patterned radiation beam onto a target portion of a substrate,
the support structure comprising an electrostatic clamp comprising:
a clamp body;
an electrode layer disposed on a top surface of the clamp body; and
a plurality of burls that project from a bottom surface of the clamp body,
wherein the electrode layer comprises a plurality of cutouts at predetermined locations that vertically correspond to locations of the plurality of burls at the bottom surface of the clamp body, the plurality of cutouts comprising at least a first cutout having a first diameter and a second cutout having a second diameter that is different from the first diameter, and
wherein the first diameter and the second diameter are configured, at the predetermined locations, to reduce electric fields that are generated around the plurality of burls.

14. The lithographic apparatus of claim 13, wherein the plurality of burls comprises contact points between the electrostatic clamp and the patterning device.

15. The lithographic apparatus of claim 13, wherein:
the patterning device comprises a reticle; and
the plurality of burls are configured to contact a backside of the reticle.

16. The lithographic apparatus of claim 15, wherein the reticle comprises a conductive coating.

17. The lithographic apparatus of claim 13, wherein each burl in the plurality of burls comprises a conductive coating.

18. The lithographic apparatus of claim 13, wherein each cutout in the plurality of cutouts has a diameter of approximately 300 to 1,400 micrometers.

19. The lithographic apparatus of claim 13, wherein each of the plurality of cutouts comprises a diameter that is larger than a diameter of each of the plurality of burls.

* * * * *

UNITED STATES PATENT AND TRADEMARK OFFICE
CERTIFICATE OF CORRECTION

PATENT NO. : 12,174,552 B2
APPLICATION NO. : 17/773004
DATED : December 24, 2024
INVENTOR(S) : Perez-Falcon et al.

It is certified that error appears in the above-identified patent and that said Letters Patent is hereby corrected as shown below:

In the Specification

In Column 2, Line 23, delete "reticle/and or" and replace with --reticle and/or--.

In Column 3, Line 51, delete "according to according to" and replace with --according to--.

In Column 9, Line 47, delete "piccoulombs" and replace with --picocoulomb--;

In Column 9, Line 59, delete "according to according to" and replace with --according to--.

In the Claims

In Column 17, Claim 8, Line 29, after "modifying" insert --the electrode layer--.

Signed and Sealed this
Fourth Day of February, 2025

Coke Morgan Stewart
*Acting Director of the United States Patent and Trademark Office*